(12) United States Patent
Lai et al.

(10) Patent No.: US 7,196,924 B2
(45) Date of Patent: Mar. 27, 2007

(54) METHOD OF MULTI-LEVEL CELL FERAM

(75) Inventors: Sheng Chih Lai, Hsinchu (TW); Ching Wei Tsai, Taoyuan (TW); Hsueh Yi Lee, Hsinchu (TW); Hsiang-Lan Lung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 109 days.

(21) Appl. No.: 11/064,315

(22) Filed: Feb. 23, 2005

(65) Prior Publication Data

US 2005/0219892 A1 Oct. 6, 2005

Related U.S. Application Data

(60) Provisional application No. 60/559,930, filed on Apr. 6, 2004.

(51) Int. Cl.
*G11C 11/22* (2006.01)

(52) U.S. Cl. ............. 365/145; 365/189.01; 365/189.09

(58) Field of Classification Search ................ 365/145, 365/210, 189.01, 133, 189.09
See application file for complete search history.

(56) References Cited

U.S. PATENT DOCUMENTS

| 5,495,438 A | 2/1996 | Omura |
|---|---|---|
| 5,668,754 A | 9/1997 | Yamashita |
| 5,999,438 A | 12/1999 | Ohsawa |
| 6,438,019 B2 | 8/2002 | Hartner et al. |
| 6,541,375 B1 | 4/2003 | Hayashi et al. |
| 6,587,367 B1 | 7/2003 | Nishimura et al. |
| 6,639,823 B2 | 10/2003 | Hasegawa |
| 6,704,218 B2 | 3/2004 | Rickes et al. |
| 6,920,060 B2 * | 7/2005 | Chow et al. ................ 365/145 |
| 6,967,858 B2 * | 11/2005 | Kang ......................... 365/145 |
| 6,982,896 B2 * | 1/2006 | Kang ......................... 365/145 |
| 2002/0145903 A1 * | 10/2002 | Hasegawa .................... 365/145 |
| 2004/0076031 A1 | 4/2004 | Roehr et al. |
| 2004/0233744 A1 * | 11/2004 | Rodriguez et al. ......... 365/200 |

OTHER PUBLICATIONS

B. Yang et al. "Low Voltage Performance of Pb(Zr,Ti)O3 Capacitors Through Donor Doping" Appl. Phys. Lett., vol. 17. No. 25, Dec. 15, 1997 pp. 3578-3580.

* cited by examiner

*Primary Examiner*—Richard T. Elms
*Assistant Examiner*—Toan Le
(74) *Attorney, Agent, or Firm*—Kenta Suzue; Haynes Beffel & Wolfeld LLP

(57) ABSTRACT

Disclosed are use methods, integrated circuits, and manufacturing methods for ferroelectric memory. A data value from multiple data values is received, for example by a state machine controlling the ferroelectric memory. The different data values correspond to different particular durations. The data value corresponding to the selected particular duration is stored in a ferroelectric memory cell by applying voltage to the ferroelectric memory cell for the particular duration.

33 Claims, 5 Drawing Sheets

METHOD OF MULTI-LEVEL CELL FERAM

REFERENCE TO RELATED APPLICATION

This application claims priority to U.S. Provisional Application No. 60/559,930 filed 6 Apr. 2004, entitled METHOD OF MULTI-LEVEL CELL FeRAM.

BACKGROUND OF THE INVENTION

1. Field of the Invention

The present invention relates to integrated circuit memory generally, and more particularly to integrated circuits with ferroelectric memory cells.

2. Description of Related Art

Ferroelectric memory integrated circuits that store multiple bits per ferroelectric memory cell program the multiple bits by applying different voltage levels to the ferroelectric memory cell. Applying different voltage levels to the ferroelectric memory cell changes the polarization of the ferroelectric material to different degrees. However, if the voltage level applied to the ferroelectric memory cell is the only input variable which determines the states of the multiple bits stored in the ferroelectric memory cell, the design of the control circuitry is constrained. For example, a particular memory application may be less suited to programming the ferroelectric memory cell, or a particular memory application may not require that a ferroelectric memory cell must be programmed in the same amount of time, regardless of the values of the multiple bits that are programmed into the ferroelectric memory cell. Accordingly, what is needed are alternatives to programming different multiple bit in a ferroelectric memory cell other than varying only the voltage level applied to the ferroelectric memory cell.

SUMMARY

One embodiment is a method of using ferroelectric memory for data storage. A data value from multiple data values is received, for example by a state machine controlling the ferroelectric memory. The different data values correspond to different particular durations. For example, a first data value corresponds to a first, shorter, particular duration, and a second data value corresponds a second, longer, particular duration. The data value having a corresponding particular duration is stored in a ferroelectric memory cell by applying voltage to the ferroelectric memory cell for the corresponding particular duration. For example, by applying voltage to the ferroelectric memory cell for a first particular duration corresponding to a first data value, the first data value is stored in the ferroelectric memory cell, and by applying voltage to the ferroelectric memory cell for a second particular duration corresponding to a second data value, the second data value is stored in the ferroelectric memory cell.

Another embodiment is an integrated circuit ferroelectric memory for data storage, which includes a semiconductor substrate, an array of ferroelectric memory cells coupled to the semiconductor substrate, and circuitry coupled to the array of ferroelectric memory cells. The circuitry is adapted to couple voltage to cells of the array of ferroelectric memory cells for a particular duration from multiple particular durations. Each particular duration of the multiple particular durations corresponds to a data value from multiple data values.

Another embodiment is a method of manufacturing ferroelectric memory for data storage. A semiconductor substrate is provided. An array of ferroelectric memory cells is formed which is coupled to the semiconductor substrate. Circuitry is formed which is coupled to the array of ferroelectric memory cells. The circuitry is adapted to couple voltage to cells of the array of ferroelectric memory cells for a particular duration from multiple particular durations. Each particular duration of the multiple particular durations corresponds to a data value from multiple data values.

In some embodiments, the voltage coupled to the ferroelectric memory cell(s) for programming the ferroelectric memory cell(s) is a constant voltage during the particular duration. The particular duration is selected from multiple particular durations, for example, within a range between a nanosecond and a second. The voltage has a magnitude, for example, within a range between 1.5 V and 5V. The ferroelectric material of the ferroelectric memory cells in some embodiments includes PZT.

In some embodiments, the sensing window is wide enough to permit the storage of multiple bits of data in a single ferroelectric memory cell. The ferroelectric memory cell storing the data value has a coercive voltage, for example, within a range between 0.9V and 1.5V. Data values are stored in ferroelectric memory cell(s) by applying the voltage, which causes a polarization of the ferroelectric memory cell(s). The polarization represents the data value. The polarization of the ferroelectric memory cell has a polarity and a magnitude, either or both of which represent the data value. Storing data in the polarization direction and not the magnitude widens the sensing window of each bit and simplifies the design. Storing data in the polarization magnitude permits multiple bits per memory cell.

In some embodiments, each value to be stored in the ferroelectric cell corresponds to both a particular time and a particular voltage for programming.

DETAILED DESCRIPTION

Figure 1:
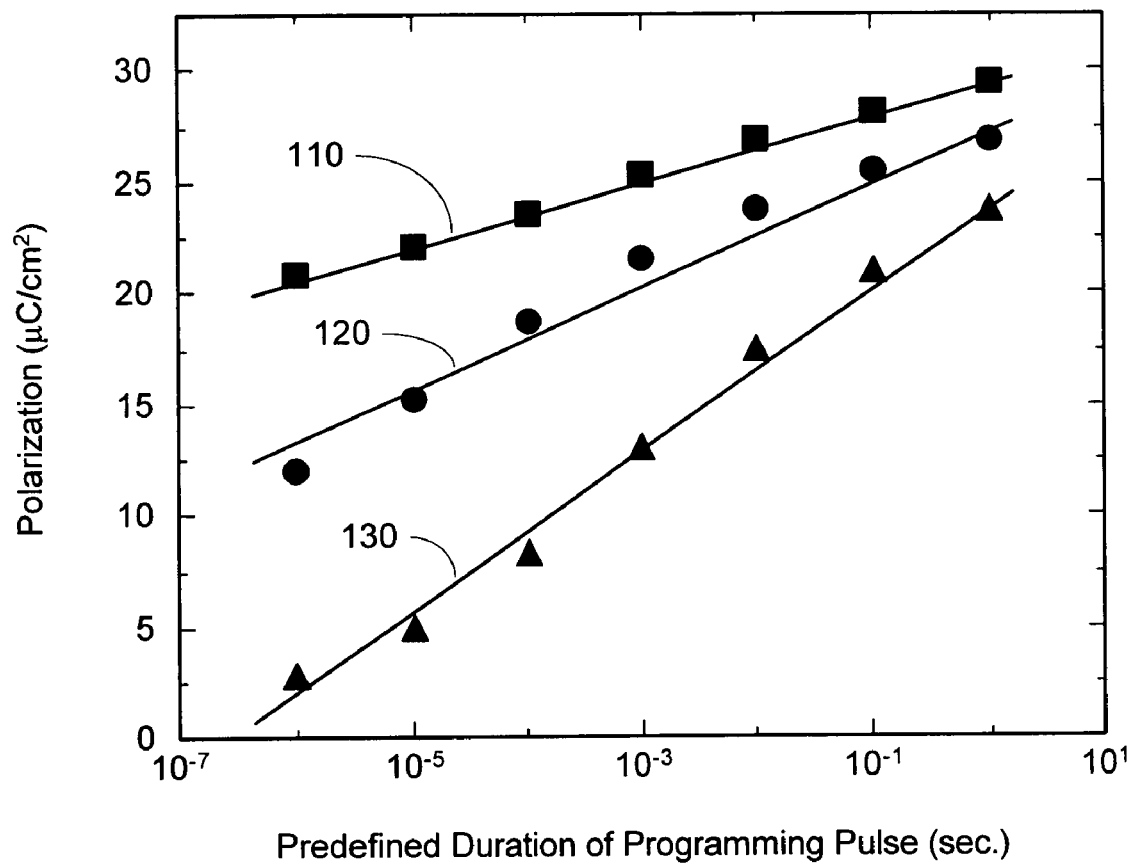
FIG. 1 shows a dependence of the polarization of ferroelectric memory.

FIG. 1 shows a dependence of the polarization of ferroelectric memory on 1) the particular duration of the programming pulse applied to the ferroelectric memory cell, and 2) the magnitude of the voltage applied to the ferroelectric memory cell during the programming pulse. The traces correspond to a constant programming voltage of −5V for trace 110, a constant programming voltage of −3V for trace 120, and a constant programming voltage of −2V for trace 130. Voltages of larger magnitude will also function, although the sensing window narrows with magnitudes of programming voltages, and larger polarization magnitude saturates at programming voltage magnitudes of around 7–10 V. The slope of trace 130 is steeper than the slope of trace 120, and the slope of trace 120 is steeper than the slope of trace 110. The relative slopes show that the sensing window widens with decreasing magnitude of programming voltage. All other factors being the same, lower magnitudes of programming voltage result in favorable conditions for storing a larger number of bits per ferroelectric memory cell. Low voltage operation is useful for advanced CMOS, SoC applications, and future generation memories. FeRAM memory cells with a constant voltage for the programming pulse don't need a charge-pumping circuit with its associated overhead, and therefore have a higher density. The coercive voltage of the ferroelectric memory cell is a limitation on how low the magnitude of programming voltage can be decreased.

The traces 110, 120, and 130 each include 7 data points corresponding to particular durations of programming pulse width ranging between about a microsecond and about a second. These data support the use storage of at least 7 discrete values in each ferroelectric memory cell, or nearly three bits per cell. Three bits or more per cell is stored for embodiments with a different arrangement of points along the traces. Numerous bits per cell are stored in embodiments that have a correspondingly sensitive sense amplifier arrangement.

Figure 2:
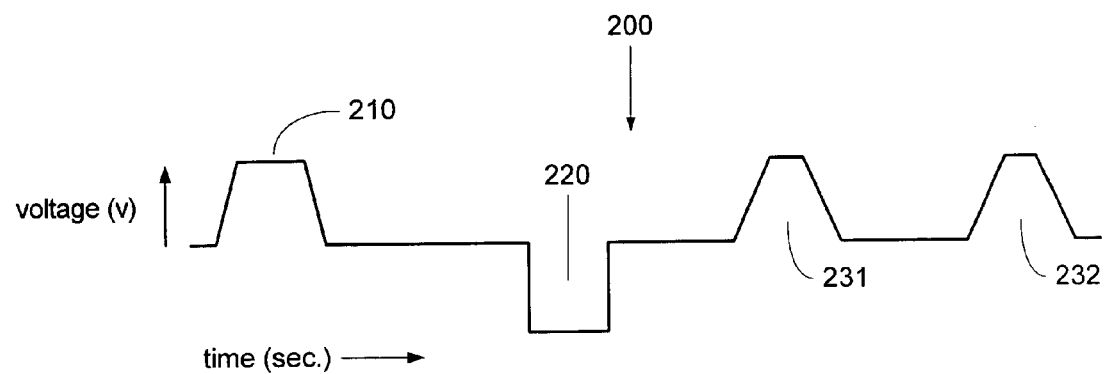
FIG. 2 shows the trace 200 used to acquire the data of FIG. 1.

FIG. 2 shows the trace 200 used to acquire the data of FIG. 1. The prepolarization pulse 210 lasts one second and has a voltage of 5V. In other embodiments, the duration of the prepolarization pulse lasts 1–50 nanoseconds. Increasing the magnitude of the prepolarization pulse reduces the amount of time it takes for the magnitude of the polarization of the ferroelectric memory cell to reach a given value, and decreasing the magnitude of the prepolarization pulse increases the amount of time it takes for the magnitude of the polarization of the ferroelectric memory cell to reach a given value. The prepolarization pulse 210 sets the initial polarization of the ferroelectric memory cell to a common polarity and magnitude prior to each measurement.

The programming pulse 220 has a particular duration which corresponds to the data value to be stored in the ferroelectric memory cell. The voltage of the programming pulse 220 has a predetermined constant voltage as shown in FIG. 1. In other embodiments, the voltage of the programming pulse 220 is nonconstant and varies over time. If the programming voltage varies over time, one degree of freedom for programming the memory cell is added to control the multiple data values. Therefore, the duration of the programming pulse can be reduced. For example, multiple values in a memory cell are achievable by fixing the duration of programming pulse at 10–100 nanoseconds as a function of the particular value, and varying the programming voltage. Because the programming speed is higher with a varying voltage for the programming pulse rather than a uniformly constant voltage with varying pulse duration, programming can be sped up by varying the voltage for the programming pulse in addition to varying the pulse duration. The particular duration may be a single duration, or multiple durations which add up to the particular duration. The programming pulse 220 causes a polarization of the ferroelectric memory cell having a polarity and a magnitude, which represent the data value stored in the ferroelectric memory cell. For the purpose of measuring the sensing window, the magnitude of the polarization is maximized during the programming pulse 220.

The first measurement pulse 231 measures the polarization of the ferroelectric memory cell following the programming pulse 220, and the second measurement pulse 232 measures the polarization of the ferroelectric memory cell following the first measurement pulse 231. The voltage polarity of the first measurement pulse 231 is opposite to the voltage polarity of the preceding programming pulse 220, and the voltage polarity of the second measurement pulse 232 is the same as the voltage polarity of the preceding first measurement pulse 231. Thus, the first measurement pulse 231 causes the polarization of the ferroelectric memory cell to switch in polarity, and the second measurement pulse 232 does not cause the polarization of the ferroelectric memory cell to switch in polarity. Taking measurements at the beginning of each of the first measurement pulse 231 and the second measurement pulse 232, followed by taking the absolute value of the difference of the two measurements, therefore measures the sensing window of the ferroelectric memory cell.

To acquire the data shown in FIG. 1, the first measurement pulse 231 and the second measurement pulse 232 have a rise time of 2.5 ms, a constant time of 2.5 ms, and a fall time of 2.5 ms. During operation of the ferroelectric memory cell in some embodiments, a read operation pulse is shorter, and has a rise time of less than about 1 ns, a constant time of about 1–20 ns, and a fall time of less than about 1 ns.

Figure 3:
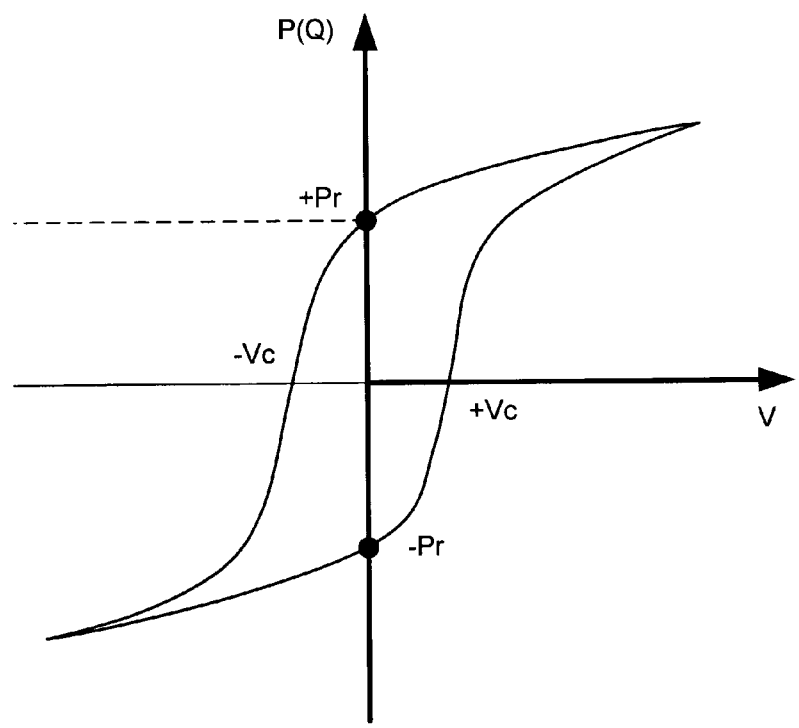
FIG. 3 shows a hysteresis curve of a ferroelectric memory cell.

FIG. 3 shows a hysteresis curve of a ferroelectric memory cell. From measurements taken at low frequency, the following relationship between coercive voltages and programming voltage magnitudes was found. The coercive voltage of the ferroelectric memory cell is a limitation on how low the magnitude of the programming voltage can be decreased. When the programming voltage is lower than the coercive voltage (such as between −1.5 V and 1.5 V), the polarization will not be switched or will be switched with a very low speed.

| Coercive voltage (Vc) | Programming voltage (|Vprog|) |
|---|---|
| 1.5 V | 5 V |
| 1.2 V | 3 V |
| 0.9 V | 2 V |

The ferroelectric memory cells which were measured for data included PZT as ferroelectric material. Other ferroelectric materials include SBT, KNO3, ABO3 perovskite structures, or any other material with that can store an electric polarization in the absence of an external electric field and which is adjustable by an external electric field.

Figure 4A:
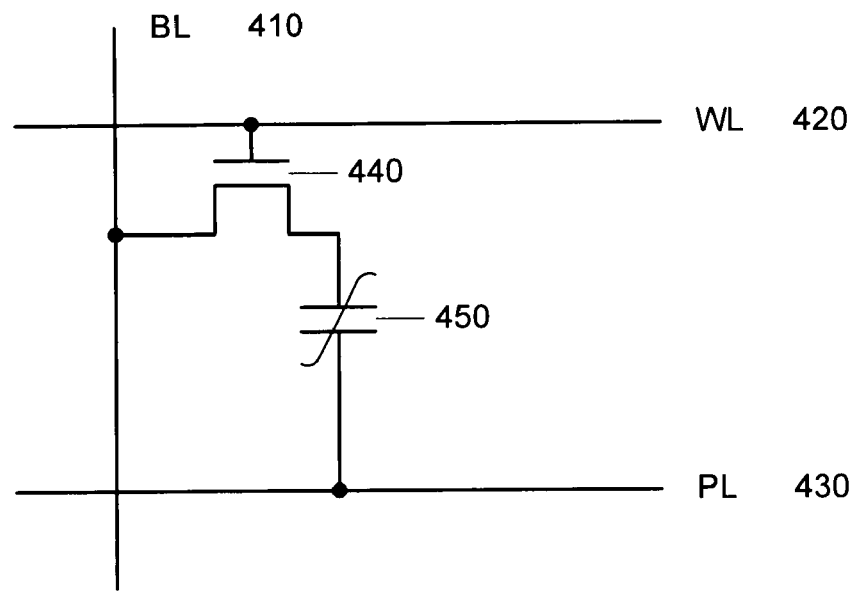
FIGS. 4A and 4B show alternative circuit arrangements that use the ferroelectric memory cell for data storage.
Figure 4B:
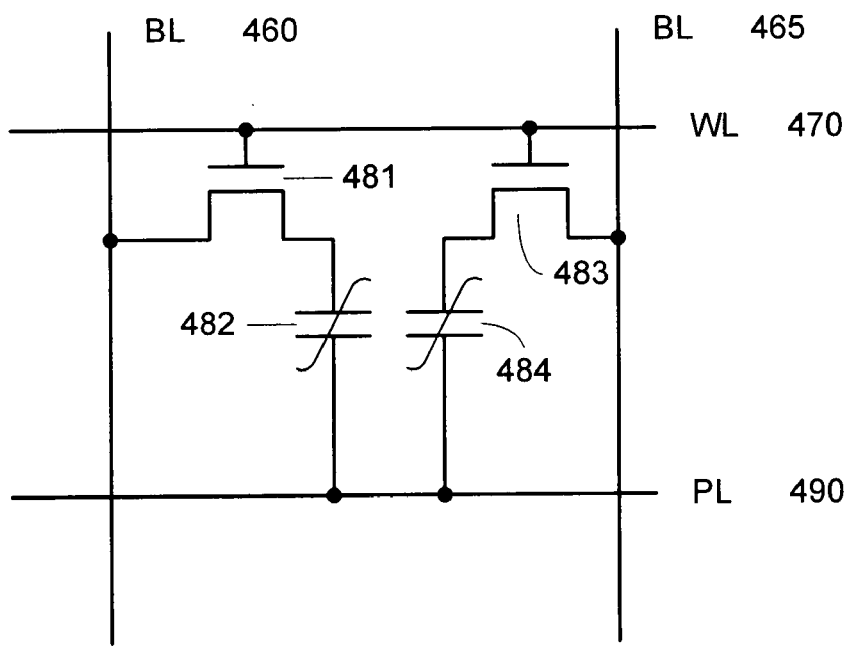

FIGS. 4A and 4B show alternative circuit arrangements that use the ferroelectric memory cell for data storage. In FIG. 4A, a memory cell includes one transistor 440 and one ferroelectric memory capacitor 450. Such memory cells commonly compare measured voltages to a global or regional reference. The memory cell of FIG. 4A includes bit line 410, word line 420, and plate line 430. A transistor 440 has a gate coupled to the word line 420, a first current-carrying terminal coupled to bit line 410, and a second current-carrying terminal coupled to a terminal of the ferroelectric memory capacitor 450. The other terminal of the ferroelectric memory capacitor 450 is coupled to the plate line 430.

In FIG. 4B, a ferroelectric memory cell includes two transistors 481 and 483 and two ferroelectric memory capacitors 482 and 484. Such memory cells commonly compare the measured voltage of one ferroelectric memory capacitor to the measured voltage of the other, reference ferroelectric memory capacitor. The memory cell of FIG. 4B includes bit line 460, bit line complement 465, word line 470, and plate line 490. A first transistor 481 has a gate coupled to the word line 470, a first current-carrying terminal coupled to bit line 460, and a second current-carrying terminal coupled to a terminal of the first ferroelectric memory capacitor 482. The other terminal of the first ferroelectric memory capacitor 482 is coupled to the plate line 490. A second transistor 483 has a gate coupled to the word line 470, a first current-carrying terminal coupled to bit line complement 465, and a second current-carrying terminal coupled to a terminal of the second ferroelectric memory capacitor 484. The other terminal of the second ferroelectric memory capacitor 484 is coupled to the plate line 490.

Figure 5:
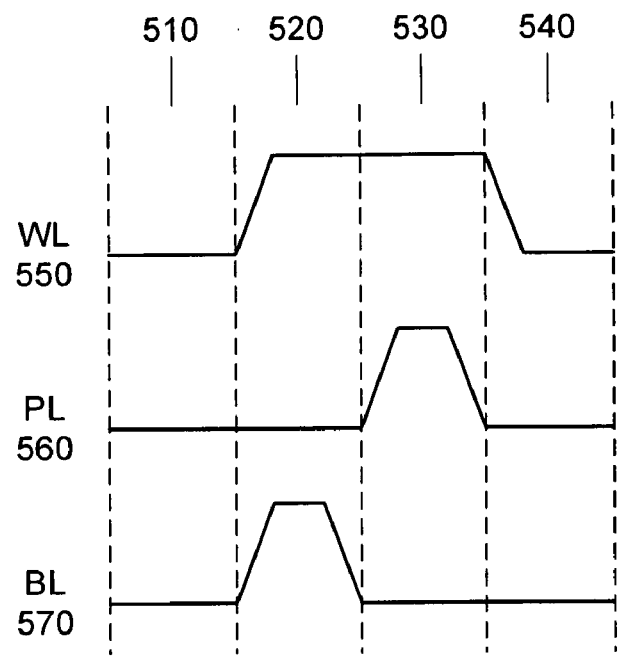
FIG. 5 shows a sample timing diagram for writing data into a ferroelectric memory cell.

FIG. 5 shows a sample timing diagram for writing data into a ferroelectric memory cell. During time 510, the voltages of word line 550, plate line 560, and bit line 570 are all low. During time 520, word line 550 goes high and bit line 570 goes high and back to low. This voltage arrangement, while word line 550 and bit line 570 are high, erases the contents of the ferroelectric memory cell. During time 530, plate line 560 goes high and back to low, and word line 550 goes back to low. This voltage arrangement, while word line 550 and plate line 560 are high, programs the contents of the ferroelectric memory cell. The duration of this voltage arrangement, while word line 550 and plate line 560 are high, determines the data value stored in the ferroelectric memory cell.

Figure 6:
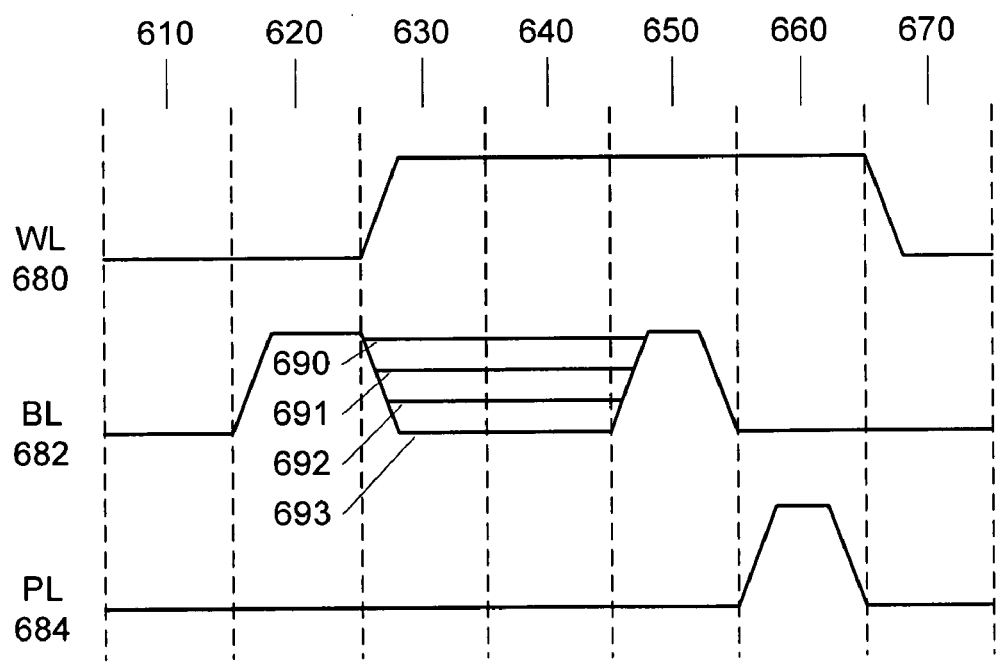
FIG. 6 shows a sample timing diagram for reading data from a ferroelectric memory cell.

FIG. 6 shows a sample timing diagram for reading data from a ferroelectric memory cell. During time 610, the voltages of word line 680, bit line 682, and plate line 684 are all low. During time 620, bit line 682 goes high. During time 630, word line 680 goes high. The resulting drop in bit line 682 indicates the data stored in the ferroelectric memory cell. During time 640, a sense amplifier measures the drop in bit line 682. During time 650, the state machine operates. The state machine is composed of logic gates, which determine the write back process. Because this kind of read scheme is destructive, the data stored in a ferroelectric memory cell will be destroyed after reading the data. The state machine determines the magnitude and duration of the plate line voltage during time 660 in FIG. 6 from the data value, which is acquired from the sense amplifier. The bit line 682 is also brought to high and to low, erasing the ferroelectric memory cell to the initial state. During time 660, the data which was read from the ferroelectric memory cell is programmed back into the ferroelectric memory cell. While the word line 660 remains high, plate line 684 is brought high and back low. The duration while plate line 684 stays high programs the ferroelectric memory cell back to store the data that was read from the ferroelectric memory cell. During time 670, the word line 680 is turned off.

Figure 7:
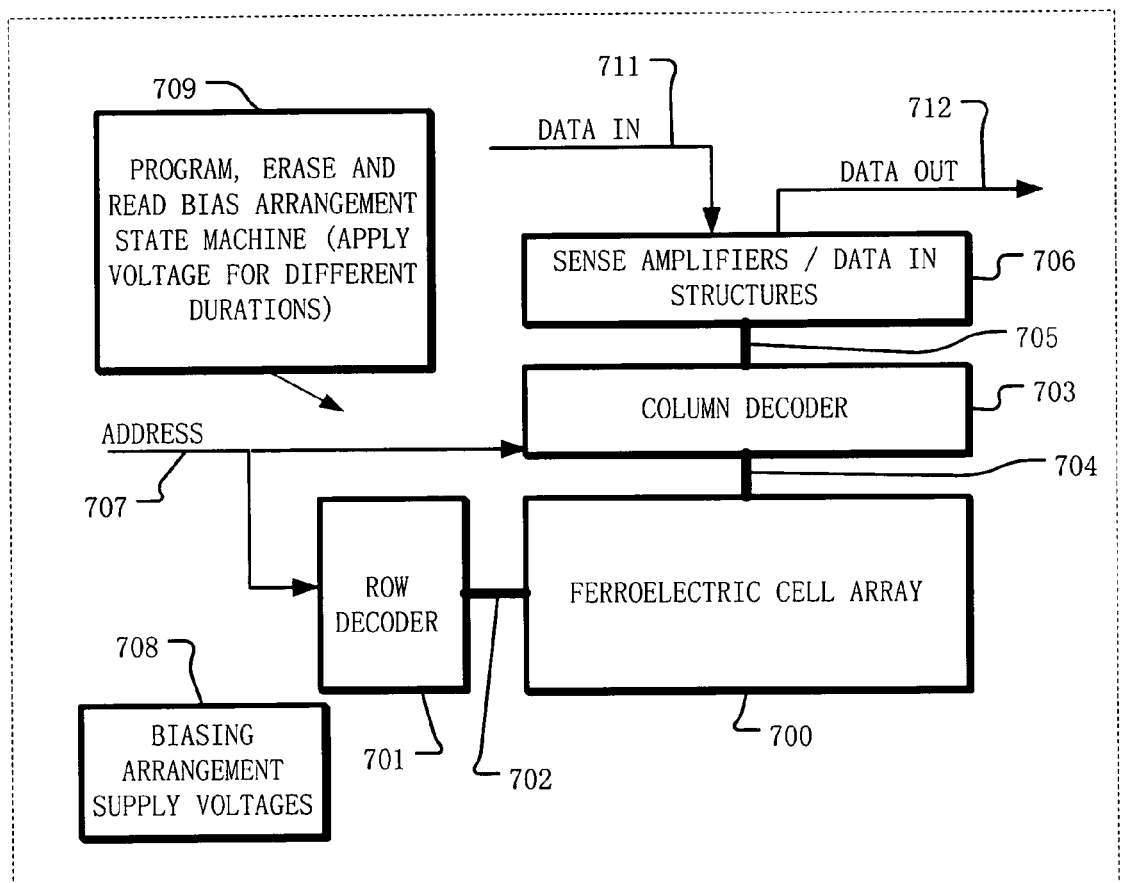
FIG. 7 shows a simplified block diagram of an integrated circuit with ferroelectric memory cells.

FIG. 7 is a simplified block diagram of an integrated circuit according to an embodiment of the present invention. The integrated circuit 750 includes a memory array 700 implemented using ferroelectric memory cells, on a semiconductor substrate. A row decoder 701 is coupled to a plurality of word lines 702 arranged along rows in the memory array 700. A column decoder 703 is coupled to a plurality of bit lines 704 arranged along columns in the memory array 700. Addresses are supplied on bus 705 to column decoder 703 and row decoder 701. Sense amplifiers and data-in structures in block 706 are coupled to the column decoder 703 via data bus 707. Data is supplied via the data-in line 711 from input/output ports on the integrated circuit 750, or from other data sources internal or external to the integrated circuit 750, to the data-in structures in block 706. Data is supplied via the data-out line 712 from the sense amplifiers in block 706 to input/output ports on the integrated circuit 750, or to other data destinations internal or external to the integrated circuit 750. A bias arrangement state machine 709 controls the application of bias arrangement supply voltages 708, such as to apply a voltage to a ferroelectric memory cell for a selected duration to store a particular data value in the ferroelectric memory cell.

The invention claimed is:

1. A method of ferroelectric memory for data storage, comprising:
   receiving a data value from a plurality of data values, wherein each of the plurality of data values has a corresponding particular duration from a plurality of particular durations;
   storing the data value in a ferroelectric memory cell by applying voltage to the ferroelectric memory cell for the corresponding particular duration.

2. The method of claim 1, wherein the voltage is a constant voltage during the corresponding particular duration.

3. The method of claim 1, wherein the voltage has a magnitude within a range between 1.5 V and 5V.

4. The method of claim 1 wherein the plurality of data values represents multiple data bits.

5. The method of claim 1, wherein said applying voltage causes a polarization of the ferroelectric memory cell, wherein the polarization represents the data value.

6. The method of claim 1, wherein said applying voltage causes a polarization of the ferroelectric memory cell, wherein a polarity and a magnitude of the polarization represent the data value.

7. The method of claim 1, wherein said applying voltage causes a polarization of the ferroelectric memory cell, wherein a magnitude of the polarization represents the data value.

8. The method of claim 1, wherein the plurality of particular durations are within a range between a nanosecond and a second.

9. The method of claim 1, wherein the ferroelectric memory cell storing the data value has a coercive voltage within a range between 0.9V and 1.5V.

10. The method of claim 1, wherein the ferroelectric memory cell includes PZT as ferroelectric material.

11. The method of claim 1, wherein each of the plurality of data values has the corresponding particular duration from the plurality of particular durations and a corresponding particular voltage from a plurality of particular voltages, and said storing applies the particular voltage to the ferroelectric memory cell for the corresponding particular duration.

12. An integrated circuit ferroelectric memory for data storage, comprising:
   a semiconductor substrate;
   an array of ferroelectric memory cells coupled to the semiconductor substrate; and
   circuitry coupled to the array of ferroelectric memory cells, the circuitry adapted to couple voltage to one or more cells of the array of ferroelectric memory cells for a particular duration from a plurality of particular durations, wherein each particular duration of the plurality of particular durations has a corresponding data value from a plurality of data values that are storable on the ferroelectric memory cells.

13. The circuit of claim 12, wherein the voltage is a constant voltage during the particular duration.

14. The circuit of claim 12, wherein the voltage has a magnitude within a range between 1.5V and 5V.

15. The circuit of claim 12, wherein the plurality of data values represents multiple data bits.

16. The circuit of claim 12, wherein the plurality of data values stored in the array of ferroelectric memory cells are represented by polarizations.

17. The circuit of claim 12, wherein the plurality of data values stored in the array of ferroelectric memory cells are represented by polarities and magnitudes of polarizations.

18. The circuit of claim 12, wherein the plurality of data values stored in the array of ferroelectric memory cells are represented by magnitudes of polarizations.

19. The circuit claim 12, wherein the plurality of particular durations are within a range between a nanosecond and a second.

20. The circuit of claim 12, wherein ferroelectric memory cells storing data values have a coercive voltage within a range between 0.9V and 1.5V.

21. The circuit of claim 12, wherein the array of ferroelectric memory cells includes PZT as ferroelectric material.

22. The circuit of claim 12, wherein the circuitry is adapted to couple a particular voltage from a plurality of particular voltages to one or more cells of the array of ferroelectric memory cells for the particular duration from the plurality of particular durations, wherein each combination of the particular duration of the plurality of particular durations and the particular voltage from the plurality of particular voltages has the corresponding data value from the plurality of data values that are storable on the ferroelectric memory cells.

23. A method of manufacturing ferroelectric memory for data storage, comprising:
providing a semiconductor substrate;
forming an array of ferroelectric memory cells coupled to the semiconductor substrate; and
forming circuitry coupled to the array of ferroelectric memory cells, the circuitry adapted to couple voltage to one or more cells of the array of ferroelectric memory cells for a particular duration of a plurality of particular durations, wherein each of the plurality of particular durations has a corresponding data value from a plurality of data values that are storable on the ferroelectric memory cells.

24. The method of claim 23, wherein the voltage is a constant voltage during the particular duration.

25. The method of claim 23, wherein the voltage has a magnitude within a range between 1.5V and 5V.

26. The method of claim 23, wherein the plurality of data values represents multiple data bits.

27. The method of claim 23, wherein the plurality of data values stored in the array of ferroelectric memory cells are represented by polarizations.

28. The method of claim 23, wherein the plurality of data values stored in the array of ferroelectric memory cells are represented by polarities and magnitudes of polarizations.

29. The method of claim 23, wherein the plurality of data values stored in the array of ferroelectric memory cells are represented by magnitudes of polarizations.

30. The method of claim 23, wherein the plurality of particular durations are within a range between a nanosecond and a second.

31. The method of claim 23, wherein ferroelectric memory cells storing data values have a coercive voltage within a range between 0.9V and 1.5V.

32. The method of claim 23, wherein the array of ferroelectric memory cells includes PZT as ferroelectric material.

33. The method of claim 23, wherein the circuitry is adapted to couple a particular voltage from a plurality of particular voltages to one or more cells of the array of ferroelectric memory cells for the particular duration from the plurality of particular durations, wherein each combination of the particular duration of the plurality of particular durations and the particular voltage from the plurality of particular voltages has the corresponding data value from the plurality of data values that are storable on the ferroelectric memory cells.

* * * * *